United States Patent [19]
Krulik et al.

[11] Patent Number: 5,212,138
[45] Date of Patent: May 18, 1993

[54] LOW CORROSIVITY CATALYST FOR ACTIVATION OF COPPER FOR ELECTROLESS NICKEL PLATING

[75] Inventors: Gerald A. Krulik, El Toro, Calif.; Nenad V. Mandich, Homewood, Ill.

[73] Assignee: Applied Electroless Concepts Inc., El Toro, Calif.

[21] Appl. No.: 763,646

[22] Filed: Sep. 23, 1991

[51] Int. Cl.$^5$ .................. B01J 23/58; B01J 27/13
[52] U.S. Cl. ..................... 502/230; 427/305
[58] Field of Search ............... 502/230; 427/304, 305

[56] References Cited

U.S. PATENT DOCUMENTS 3,874,882  4/1975  Gulla et al. .............. 427/304 X
3,969,554  7/1976  Zeblisky .................. 427/304 X

OTHER PUBLICATIONS

G. G. Gawrilou, Chemical (Electroless) Nickel Plating, Portcallis Press, 1979, p. 114 plus title and 1st Table of Contents page (3 total).

*Primary Examiner*—W. J. Shine
*Attorney, Agent, or Firm*—Lawrence I. Field

[57] ABSTRACT

This invention relates to electroless nickel plating of metals which are normally noncatalytic for electroless nickel initiation. It is especially useful in the electronics industry, including production of electroless nickel-/electroless gold tabs or surface mount pads on printed circuit boards, and for use in electroless nickel plating over copper for radiofrequency interference shielding. More particularly, it comprises alkali halide salt solutions of a palladium salt with another Group VIII precious metal salt in an inorganic acid solution for effectively and completely catalyzing the initiation of electroless nickel plating on copper substrates.

15 Claims, No Drawings

LOW CORROSIVITY CATALYST FOR ACTIVATION OF COPPER FOR ELECTROLESS NICKEL PLATING

BACKGROUND OF THE INVENTION

1. Field of the Invention

This invention relates to electroless nickel plating of materials such as copper substrates which do not spontaneously initiate electroless nickel plating without a catalyst. It is especially useful in the electronics industry, including production of electroless nickel/electroless gold tabs or surface mount pads on printed circuit boards, and for use in electroless nickel plating over copper for radiofrequency interference shielding. More particularly, it comprises new and improved compositions for effectively and completely catalyzing the initiation of electroless nickel plating on copper substrates. These novel compositions comprise mixtures of a palladium salt with another Group VIII precious metal salt plus both an acid and an alkali halide salt for catalyzing the initiation of electroless nickel plating.

2. Background and Prior Art

Numerous methods have been used to selectively catalyze copper metal for initiation of electroless nickel plating. Copper is considered a poor or even a noncatalyst for electroless nickel compositions using sodium hypophosphite as the nickel reducing agent. Some method must be used to cause the initial plating of electroless nickel. Once a small amount of electroless nickel has plated, electroless nickel plating will continue without need for further catalyzation of the surface.

Numerous methods are known to initiate electroless plating onto metals which will not spontaneously begin plating. G. G. Gawrilov (in Chemical (Electroless) Nickel Plating, Portcullis Press) gives the following methods: contact with aluminum or iron wire while immersed in the electroless nickel; applying a pulse of electric current when first immersed in the electroless nickel; soaking in a solution of sodium borohydride, dimethylaminoborane, or other organoboron reducing agent immediately before immersion in the electroless nickel; electroplating with a thin layer of electrolytic nickel; using an electroless nickel 'strike' bath of high hypophosphite concentration; and immersion in an acid solution of palladium chloride.

The most common catalytic initiation method is the use of a solution of palladium chloride (0.01–0.3 g/l) in hydrochloric acid.

All of these methods suffer from one or more disadvantages. Contact with aluminum or iron wires is useful only for small parts. Printed circuit boards having discrete separate copper pads and circuits cannot be done, as each separated portion of copper will need to be touched. The electric current method and the electrolytic nickel plating methods likewise cannot be used on discontinuous copper sections. If the electric current method is used on large and complex parts with crevices and recessed areas, poor and nonuniform catalysis occurs. Surface treatment with solutions of boron reducing agents can be effective, but these solutions are high in actual usage cost since they rapidly decompose when trace amounts of metal ions are introduced. The boron reducing agents can also desorb from the part and destabilize electroless nickel plating solutions. Use of a very active hypophosphite electroless nickel 'strike' is not reliable, and the strike bath quickly decomposes.

The best and most widely used commercial catalysis method is the use of a highly acidic solution of palladium chloride. A typical commercial formulation is Activator 440 (Enthone Inc.). This consists of 4.4 g palladium chloride per liter in 8% hydrochloric acid. Recommended use condition is dilution to 6%, or 275 mg palladium chloride per liter. Hydrochloric acid is added as necessary to control hydrolytic decomposition of the palladium chloride. While effective under normal circumstances, it suffers from several disadvantages, especially when used to catalyze printed circuit boards. Palladium chloride rapidly attacks and forms an immersion deposit on most metals. This deposit does not give a continuous metallic deposit. It forms small catalytic sites which continue to grow as long as the copper is immersed in the catalyst solution. Excess catalysis leads to overactivation problems in the electroless nickel, as excess palladium may not adhere completely. This will contaminate and decompose the electroless nickel, and also cause poor adhesion of the electroless nickel. The operating window for good catalysis is very narrow, requiring precise control of immersion time and palladium concentration. Good rinsing is critical for good results. Consumption and overuse of palladium is very great. Printed circuit boards, especially those having numerous small discrete copper areas, are difficult to uniformly plate with the reliability needed for a commercial process. This problem is especially severe when dealing with boards intended for surface mount applications. These boards have tiny wells produced by a 1–5 mil thick layer of organic solder mask completely surrounding the surface mount tabs. These wells are very difficult to completely rinse and catalyze.

The commercial catalytic olefin oxidation process known as the Wacker process uses acidic palladium chloride solutions. Only ionic palladium is catalytic for this process, and it is reduced to palladium metal during olefin oxidation. A second catalytic cycle is coupled with this process to continuously regenerate ionic palladium. The second catalyst system consisting of air and cupric chloride rapidly redissolves metallic palladium. While not wishing to be bound by theory, it is known that copper ions rapidly build up in any acidic palladium bath used for copper catalysis. Older used baths are less effective than fresh baths, even when the palladium concentration is controlled. It is likely that a complex precipitation-redissolution cycle involving ionic and metallic palladium, ionic and metallic copper, air and acid, all contribute to the difficulties in achieving uniform process control and reproducibility.

A related patent disclosure Ser. No. 07/756,626 filed Sept. 9, 1991, now abandoned, by the present applicants has shown that improved results for catalyzation of copper can be effected by use of mixtures of palladium and a Group VIII precious metal salt in acidic solution. This process does suffer from several disadvantages. The highly acidic catalyst is corrosive to the substrate, so immersion times must be controlled and of short duration to prevent overdeposition of catalyst on the surface. The copper which is dissolved in the catalyst solution can attack and redissolve the deposited palladium metal, leading to poor adhesion. The pH of the catalyst bath must be kept low with hydrochloric acid, to prevent catalyst decomposition due to spontaneous hydrolysis of the precious metal salts. Rinsing is difficult due to the rapid hydrolysis of the catalyst as the pH is increased.

SUMMARY OF THE INVENTION

The present invention has discovered that alkali halide salt solutions of a mixed precious metal catalyst solution give significantly better results for electroless nickel initiation on copper than does a pure acidic solution of the same precious metal salts. Lower acidity alkali halide salt solutions used with mixed palladium chloride/ruthenium chloride catalysts show more uniform activation, easier activation, longer catalyst bath life, and fewer problems with overactivation and nickel adhesion. The higher pH halide salt mixed catalyst system results in more stable electroless nickel baths since the catalyst is more adherent to the metal. It is highly resistant to formation of loosely adherent catalyst colloids which otherwise are produced by hydrolytic decomposition of the precious metal salts during rinsing. The process window for these novel lower acidity mixed catalysts is much wider than for the traditional highly acidic metal catalyst systems.

These novel compositions work well at room temperature but they are also effective at an elevated temperature. It is theorized that these lower acidity halide salt mixed precious metal catalysts may work more effectively because their rate of attack on the copper substrate is significantly decreased, yet still sufficient to produce a catalytic deposit. The concentration of alkali metal salt is between about 5 and 500 g/l and preferably between about 20 and 250 g/l. The high concentration of halide salt will maintain the precious metals in solution without hydrolytic decomposition to ineffective hydroxides or oxides or metal colloids. Rinsing is more effective as the formation of colloidal materials in the first rinse is greatly retarded, lessening the change of random non-adherent catalyst deposition on non-conductive surfaces.

The compositions also include an inorganic acid.

Palladium is the most soluble of the six precious transition metals (palladium, ruthenium, rhodium, platinum, iridium, osmium). Palladium will dissolve easily in plain nitric acid. Rhodium, platinum, and iridium are not dissolved in nitric acid, but will dissolve in aqua regia. Osmium and ruthenium will not dissolve in any acid up to the boiling point. The mixed deposits of any of the other five metals with palladium are expected to be more chemically resistant than pure palladium metal. All of the six precious transition metals are singly known to be effective as electroless nickel initiation catalysts. All of these Group VIII precious metals form soluble halide complexes which are stable at high halide concentrations, even at relatively high pH.

The higher pH halide salt mixed catalyst system also results in more stable electroless nickel baths since the catalyst is much less prone to hydrolysis or colloid formation during rinsing. These hydrolysis products and metal colloids can cause significant destabilization if dragged into the electroless nickel bath. It is well known that such materials are adherent and hard to completely remove once formed. The higher pH halide salt systems give much improved rinsing due to the slower rate of hydrolysis when these materials are rinsed. Cross-sections of the electroless nickel deposit on alkali halide mixed catalyst systems show a much thinner black line of catalyst than is seen with highly acidic mixed catalyst systems, yet the total performance is superior.

These novel catalytic compositions are not limited in usefulness to copper catalyzation. They may also be used on other normally noncatalytic or difficult to catalyze surfaces such as silver, silver inks, mixed metal particle inks, conductive paints, etc. Likewise, these novel compositions may be useful with any electroless metal plating bath, such as electroless silver, electroless copper, and electroless gold.

DESCRIPTION OF THE PREFERRED EMBODIMENTS

Although the disclosure hereof is detailed and exact, the formulations listed in the examples are merely illustrative of the useful catalyst formulations. Any formulator skilled in the art can utilize these examples and this concept to prepare many workable solutions in addition to those shown in the examples.

The test materials used for catalysts consisted of solutions of palladium(II) chloride and ruthenium(III) chloride in hydrochloric acid and sodium chloride. Test articles were copper clad epoxy glass printed circuit board material. These boards were electively etched to give a variety of discrete copper pad and circuit areas, using the standard Institute of Printed Circuits solder mask test grid, A-25. The boards were then coated with Probimer(TM) (Ceiba-Geigy Corp) on the bare epoxy areas. This gives printed circuit and surface mount simulation test pads. The cleaner as Duraclean LPH-3 (Duratech Industries Inc). The microetchant was Ardrox PC-7076 (Ardrox Inc.). The electroless nickel solution used as Niposit 65 (Shipley Company). The immersion gold solution was Lectroless Prep (Enthone-OMI-Selrex). The autocatalytic electroless old was Microgold 294 (Stapleton Technologies Corp.).

EXAMPLES 1-5

Test panels were copper-clad double sided printed circuit boards selectively etched and coated with Probimer(TM) solder mask to give discrete exposed copper pads and circuits. Test panels were all given a standard process cycle before and after catalysis. This cycle is given in Table I. Rinses are understood between each process step.

TABLE I

| | |
|---|---|
| Clean | Duraclean LPH-3; 1 min |
| Microetch | Ardrox PC-7076; 1 min |
| Acid Dip | Sulfuric acid, 10%; 0.5 min |
| Acid Dip | Hydrochloric acid, 10%; 0.5 min |
| Catalyst | Per examples |
| Electroless nickel | Niposit 65; 20 min |
| Immersion gold | Lectroless Prep; 1 min |
| Electroless gold | Microgold; 10 min |

Catalyst quality was measured in several ways. The electroless nickel thickness was measured. The electroless gold bath will attack exposed copper, causing adhesion and appearance failures, so this is a sensitive indicator of the nickel porosity and incomplete coverage.

The first example shows the results for a standard mixed palladium chloride/ruthenium chloride/hydrochloric acid catalyst.

EXAMPLE 1

The catalyst solution consisted of 100 mg/l palladium chloride and 150 mg/l ruthenium chloride in 5% hydrochloric acid. Immersion time was 3 min at 100 F. Electroless nickel thickness was 219 millionths of an inch. Electroless nickel adhesion was good. Electroless gold appearance was good and adhesion was excellent.

Examples 2-5 show the greater activity of the new catalyst and illustrate some of the available range of concentrations which are usable.

EXAMPLE 2

The catalyst solution consisted of 100 mg/l palladium chloride and 150 mg/l ruthenium chloride in a solution of 120 g/l sodium chloride and 1% hydrochloric acid. Immersion time was 1 minute at room temperature. The electroless nickel thickness was 331 millionths of an inch. Adhesion and appearance of the total coating was excellent.

EXAMPLE 3

The catalyst solution consisted of 100 mg/l palladium chloride and 50 mg/l ruthenium chloride in 120 g/l sodium chloride and 0.5% hydrochloric acid. Immersion time was 1 minute at room temperature. The electroless nickel thickness was 311 millionths of an inch. Adhesion and appearance of the total coating was excellent.

EXAMPLE 4

The catalyst solution consisted of 50 mg/l palladium chloride and 50 mg/l ruthenium chloride in 90 g/l sodium chloride and 0.5% hydrochloric acid. Immersion time was 1.5 minutes at 130 F. The electroless nickel thickness was 195 millionths of an inch. Adhesion and appearance of the total coating was excellent.

EXAMPLE 5

The catalyst solution consisted of 50 mg/l palladium chloride and 150 mg/l ruthenium chloride in 240 g/l sodium chloride and 1% hydrochloric acid. Immersion time was 1.5 minutes at 130 F. The electroless nickel thickness was 170 millionths of an inch. Adhesion and appearance of the total coating was excellent.

What is claimed is:

1. A catalyst composition for initiation of an electroless metal plating composition on otherwise nonplatable metallic materials, comprising an aqueous solution containing a mixture of a palladium salt and at least one other Group VIII precious metal salt, an alkali halide salt and an inorganic acid.

2. The catalyst composition of claim 1 wherein the concentration of alkali halide salt is between about 5 and 500 g/l.

3. The catalyst composition of claim 1 wherein the concentration of alkali halide salt is between about 20 and 250 g/l.

4. The catalyst composition of claim 1 wherein said alkali halide salt is a chloride salt.

5. The catalyst composition of claim 1 wherein said alkali halide salt is sodium chloride.

6. The catalyst composition of claim 1 wherein said alkali halide salt is potassium chloride.

7. The catalyst composition of claim 1 wherein said other Group VIII precious metal is ruthenium.

8. The catalyst composition of claim 1 wherein said nonplatable metallic materials include copper.

9. The catalyst composition of claim 1 wherein said nonplatable metallic materials include silver.

10. The catalyst composition of claim 1 wherein said inorganic acid is sulfuric acid.

11. The catalyst composition of claim 1 wherein said inorganic acid is hydrochloric acid.

12. The catalyst composition of claim 1 wherein said electroless metal plating composition includes electroless nickel.

13. The catalyst composition of claim 1 wherein said electroless metal plating composition includes electroless copper.

14. The catalyst composition of claim 1 wherein aid electroless metal plating composition includes electroless gold.

15. The catalyst composition of claim 1 wherein said electroless metal plating composition includes electroless silver.

* * * * *